United States Patent
Balamurugan (10) Patent No.: US 6,174,788 B1
(45) Date of Patent: Jan. 16, 2001

(54) PARTIAL SEMICONDUCTOR WAFER PROCESSING WITH MULTIPLE CUTS OF RANDOM SIZES

(75) Inventor: Subramanian Balamurugan, Plano, TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/262,265

(22) Filed: Mar. 4, 1999

Related U.S. Application Data (60) Provisional application No. 60/076,728, filed on Mar. 4, 1998.

(51) Int. Cl.[7] ............................ H01L 21/46; H01L 21/78; H01L 21/301; G01C 17/38; G01P 21/00
(52) U.S. Cl. .................... 438/460; 438/462; 438/973; 438/975; 702/95; 221/209
(58) Field of Search .................................. 438/113, 464, 438/460, 462, 973, 975; 702/95; 221/209; 382/151

(56) References Cited

U.S. PATENT DOCUMENTS

| | | | |
|---|---|---|---|
| 4,914,601 | * 4/1990 | Smyth | 364/490 |
| 4,972,311 | * 11/1990 | Holdgrafer | 364/167.01 |
| 5,355,212 | * 10/1994 | Wells | 356/237 |
| 5,362,681 | * 11/1994 | Roberts | 437/226 |
| 5,798,947 | * 8/1998 | Ye | 361/589 |

* cited by examiner

Primary Examiner—Charles Bowers
Assistant Examiner—Nema Berezny
(74) Attorney, Agent, or Firm—Robert L. Troike; Frederick J. Telecky, Jr.

(57) ABSTRACT

Partial wafer processing is achieved by down loading the wafer map of the whole wafer from a host (12) and if the partial wafer contains the reference die (14) move table to a locator die (15) and upload locator die coordinates to wafer map data host (16) and remove other partial wafer die coordinates from the map (17). If the partial wafer does not have the reference die and is not the last partial wafer, position wafer table to auxiliary reference die (18), validate the auxiliary reference die position (19) and compute auxiliary reference die coordinates from locator die coordinates (20) and move wafer table to locator die (22) and upload locator die coordinates to wafer map data host (23) and then using auxiliary reference die and locator die coordinates as information remove other partial wafer die coordinates from the map (24). If the partial wafer does not have the reference die and is the last partial wafer, position wafer table to auxiliary reference die (18), validate the auxiliary reference die position (19) and compute auxiliary reference die coordinates from locator die coordinates (20) and then using auxiliary reference die coordinates as information remove other partial wafer die coordinates from the map (25).

7 Claims, 10 Drawing Sheets

PARTIAL SEMICONDUCTOR WAFER PROCESSING WITH MULTIPLE CUTS OF RANDOM SIZES

RELATED CO-PENDING APPLICATION

This application claims priority under 35 USC § 119(e)(1) of provisional application Ser. No. 60/076,728, filed Mar. 4, 1998.

This invention is related to application Ser. No. 08/667, 246 filed Jun. 20, 1996 entitled, "Method and Apparatus for Aligning the Position of Die on a Wafer Table," of Balamurugan. This application is incorporated herein by reference.

TECHNICAL FIELD OF THE INVENTION

This invention relates to semiconductor wafer processing and more particularly to partial wafer processing in die bonders for wafermap operations.

BACKGROUND OF THE INVENTION

Semiconductor manufacturing includes the process of die attached performed by a die bonder or die attach machine. The basic operation of die bonder is to mount dies on lead frames. The die bonder deposits epoxy on the lead frame pad, picks up a die, and places it on the lead frame die pad. The epoxy is a historic term and is actually an adhesive which uses no catalyst.

The die is picked up by suction. The good dies are individually picked up and placed on a lead frame. To do this the location of the die must be precisely known so the machine can pick up the die.

The silicon wafer provides several patterns, to form a plurality of semiconductor circuits. The individual integrated circuits on the wafer are separated by horizontal and vertical thoroughfares. The thoroughfares are border spaces between the semiconductor devices on the wafers. Along these thoroughfares are formed the saw streets when a cutter passes through them separating the individual circuits into what is termed "dies". This process is referred to as sawing. Before cutting the separate circuits, the back of the wafer is placed on a double backed tape which in turn is stretched like a drum over a ring base called flexframe on a controllable wafer table. The location of the dies on the original wafer is recorded on the wafer map stored in a memory. After sawing the wafer, the dies are moved. Hence moving the wafer table per the wafer map coordinates does not accurately position the wafer table for the next die to be picked. Small die wafer map operation on die bonder equipment is not feasible because of this. The variation in the saw street width across the wafer coupled with the tape shrinkage on partially picked wafers makes the one time correction of table jump distance for street width variation ineffective in ensuring the accurate table position.

A full wafer has one reference die. Sometimes it is desirable to only use part of a wafer for a particular job and store away the remaining for later use. The partial use will usually result in removal of the reference die. Therefore a reference die may not be available.

SUMMARY OF THE INVENTION

In accordance with one embodiment of the present invention a whole wafer is cut perpendicular to the wafer flat to form partial wafers. The coordinates for a locator die and/or an auxiliary reference die of the partial wafers are stored on a wafer map of a given wafer for locating dies on a partial section of the given wafer.

These and other features of the invention that will be apparent to those skilled in the art from the following detailed description of the invention, taken together with the accompanying drawings.

DETAILED DESCRIPTION OF THE INVENTION

Figure 1:
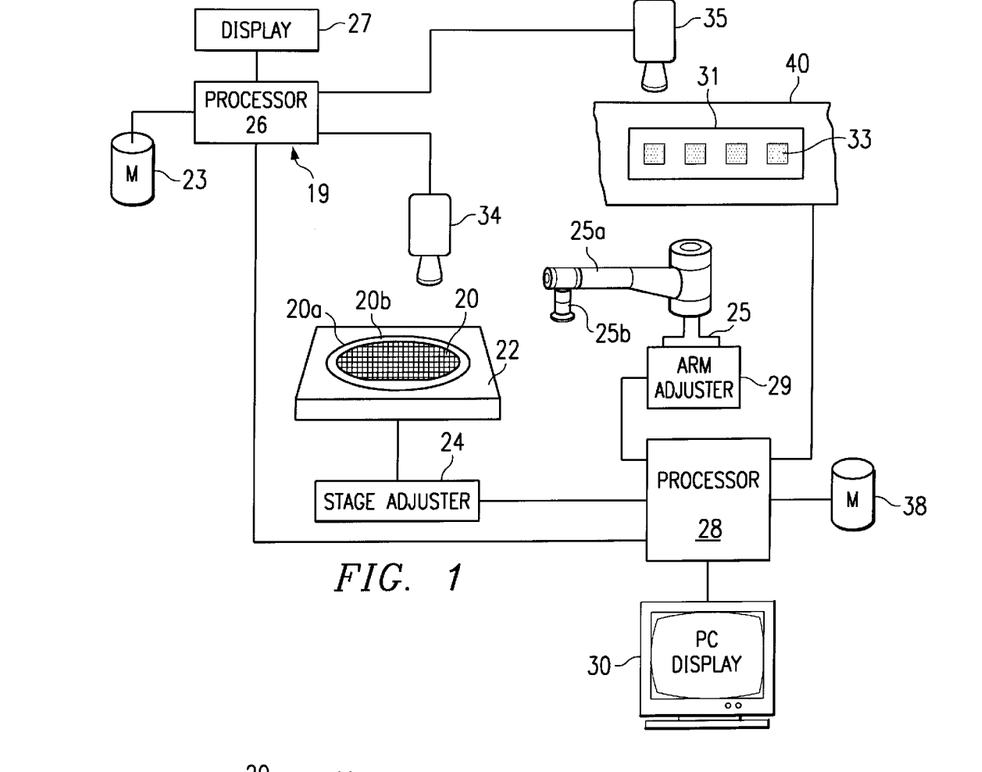
FIG. 1 is a diagram of the system according to one embodiment of the present invention.

Referring to FIG. 1, there is illustrated a schematic representation of an alignment system using a die bonder (die mounter or die attach) that may be used in the fabrication process of integrated circuits on silicon wafers according to the present invention. The die bonder may be, for example, Abacus IIID-SA Die Bonder of Texas Instruments Incorporated. A die bonder dispenses epoxy on a die pad of a lead frame and mounts the die to the pad. A silicon wafer 20 is carried by a table 22 which is moveable in conjunction with a table adjuster 24, which is coupled to table 22. A robot 25 of the system, including a controllable arm 25a and suction end effector 25b, picks up the die and places the die and on pad 33 of lead frame 31 by arm adjuster 29. The robot 25 is controlled by processor 28. The lead frame handling system 40 moves and positions the lead frame to allow placement of the die. The lead frame handling system 40 also applies the epoxy to the pad 33 of lead frame 31 before the die is placed on the lead frame 31. The wafer table 22 via the adjuster 24 moves the wafer 20 to locate the next die under program control of processor 28 so that robot arm 25a picks up the die from wafer 20 and places it on pad 33 of lead frame 31. After the table 22 is moved to one good die the align system 19 takes over for good alignment initiated by processor 28. The align system 19 consists of a processor 26, display 27, storage device 23, camera 34, and camera 35. The align system 19 provides an align correction signal to align a die accurately and is coupled to processor 28. During the alignment process, an output signal is produced by processor 26 and, the output signal may be delivered to the table adjuster 24 through processor 28 so as to reposition the wafer table in response to an output signal. The substance of the output signal may also be displayed by the processor 26 on the display 27. In order to perform the alignment or misregistration check, processor 26 receives a video image from a video camera 34 (such as a CCD camera) which is a subsystem of the alignment system. The camera includes the optics to focus on the wafer or lead frame. The video signal is digitized using, for example, a video to digital converter as part of the camera. Whenever an alignment is made, the processor 26 takes a picture via the camera 34 and looks for a pre-taught (stored) pattern. In one embodiment a unique pattern is in the die and is stored and when an alignment call is made the align system takes a picture and looks for that pattern. In another embodiment the align system takes a picture and aligns to the four sides (streets) of the die. The pattern of the integrated circuit is taught or stored in a memory of the processor 26 or memory or storage 23 at; the time the device is setup. The processor 26 calculates the displacement of the stored pattern (alignment point) to current pattern and provides a correction signal. This displacement in x and y direction is the x and y correction. This correction signal dependent on the correction value through processor 28 is sent to the wafer table adjuster 24 from processor 26 for accurately positioning of the table so the die is picked up. If the displacement is too great so the stored pattern to current pattern is too great the align system 19 will not be able to do the alignment. It is therefore very important that before alignment is done, the wafer table 22 is moved close to the alignment point. The precise location of the lead frame 31 may be determined by align system 19 using a second camera 35 (such as a CCD video camera)also coupled to the processor 26. The wafer map identifying the locations of the dies and which dies are good or bad are stored in the wafer map in storage 38. When bad dies have been identified they are marked and the information is stored in the storage 38 so that the system coupled to the storage knows the bad dies and skips or jumps these bad dies. The align system 19 gives the correct distance to the wafer table adjuster 24 to move the table 22 if not aligned sufficiently for the pickup device to pick up the die. The robot arm 25a picks up the properly aligned die and places it on the pad of the lead frame. The lead frame handling system 40 then moves the next lead frame pad into position. The present application is particularly directed to the step of accurately moving the wafer table to every good die on the wafer so that the align system 19 can align the die properly and enable the robot arm 25 to pick up the good dies.

Figure 2A:
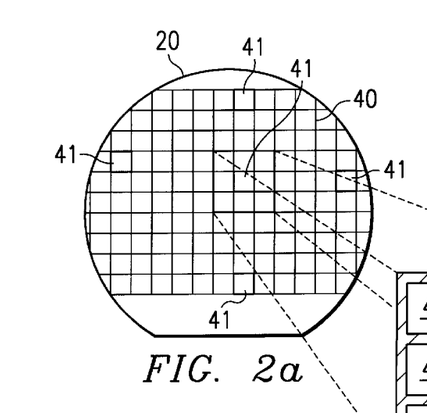
FIGS. 2a, 2b illustrates a prior art wafer and thoroughfares on a wafer.
Figure 2B:
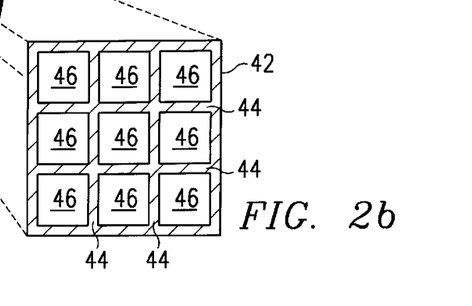

Referring to FIG. 2a there is shown silicon wafer 20 with a reducible layout 40 shown there on. An exploded section 42 shown in FIG. 2b shows four scribe line segments 44 defining chips 46. Although the pattern formed by the described segments shown in exploded section are uniform, it is to be understood that an exploded view on most all wafers would contain unique line segments. The line segments 44 are thoroughfares extending to both horizontal and vertical directions separating the separate integrated circuits or chips 41. The wafers before being cut are stuck on a double-backed tape 20b and the tape 20b is stretched over a support ring 20a as illustrated in FIG. 1. As the cutter passes through the thoroughfares 44 the saw streets are formed which separates the individual die pieces or chips. After the cutting of the wafer, the variation in saw street width coupled with the tape shrinkage due to pulling on the tape, the wafer table jump may not be accurate. This is particularly true for large jumps between good dies. The saw street width vary across the wafer in both axes due to uneven wafer mount tape expansion, saw blade variations, etc. There is also a change in distance between the dies, due to shrinkage of the tape on which the wafer is mounted, as the dies are picked off the wafer. After the sawing or cutting has occurred, the align system 19 and the processor 28 compute the average saw street width in both the horizontal and vertical axes.

Figure 3:
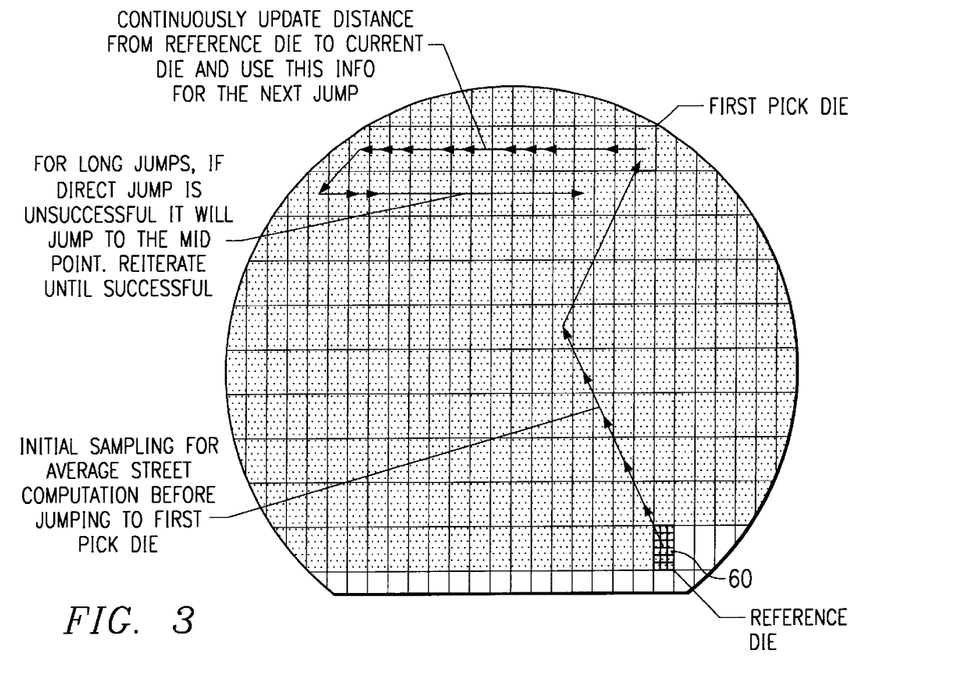
FIG. 3 illustrates a prior art wafer with a reference index.
Figure 3A:
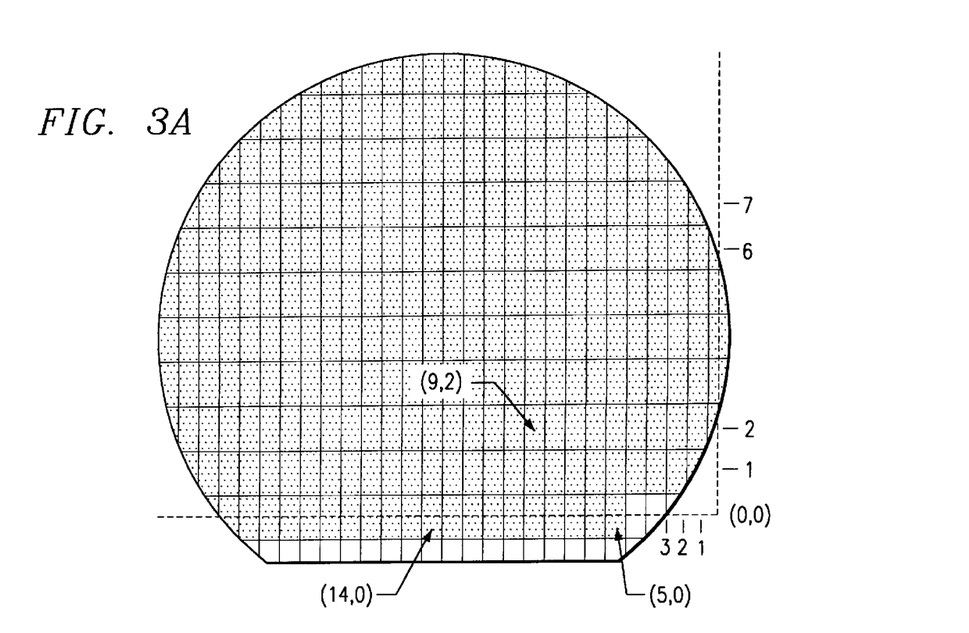
FIG. 3a illustrates wafer map coordinates.

The present invention modifies the current system to allow for partial wafers. As illustrated in FIG. 3, a traditional wafer map system uses a single fixed reference point. This reference die may be identified by the right most fully patterned die in the first row next to the blanks. FIG. 3a illustrates wafer map coordinates. If the wafer is separated, then all pieces (partial) except one will be without reference points, making wafer map processing impossible. The present invention provides auxiliary reference dies for each partial wafer and enables processing of partial wafers using wafermapping. The method includes cutting all whole wafers perpendicular to the wafer flat to form the partial wafers.

Figure 4:
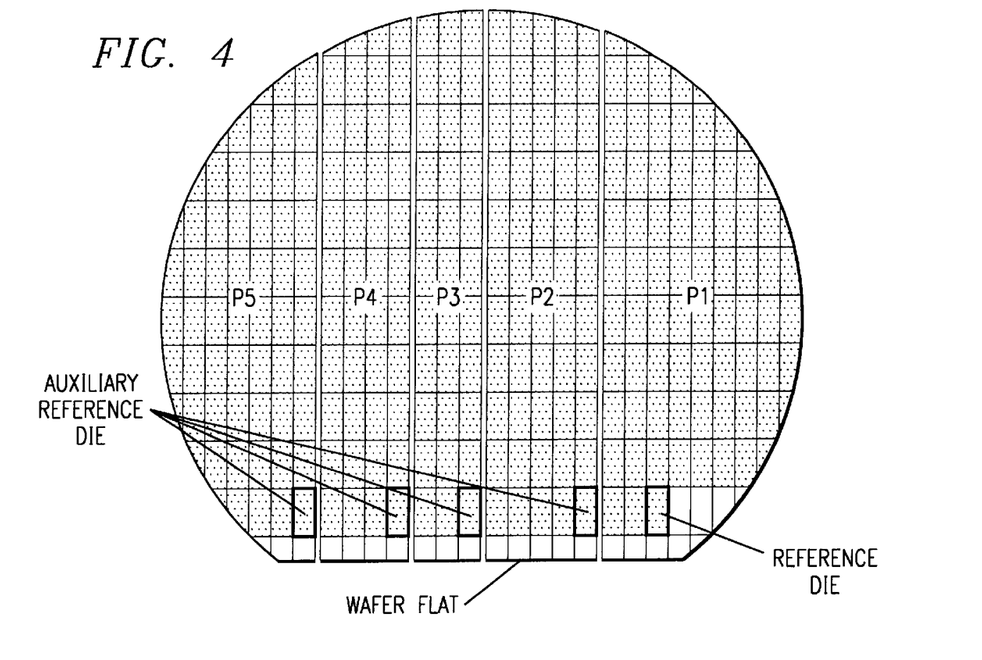
FIG. 4 illustrates reference die and auxiliary reference die according to one embodiment of the present invention.

Referring to FIG. 4 there is illustrated five partial wafers P1 to P5 where all partial wafers are formed by cuts perpendicular to the wafer flat. The reference die is located in the first partial wafer P1 and an auxiliary reference die is located in other partial wafers P2 to P5 in the lower right corner on the same row as the reference die.

Figure 5:
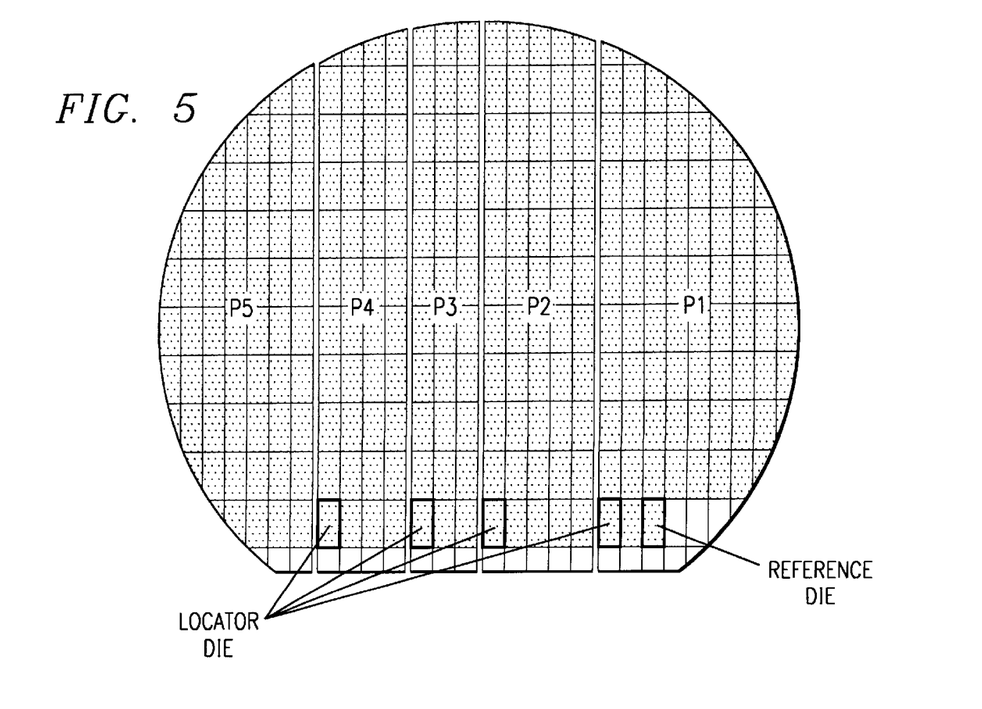
FIG. 5 illustrates reference die and locator die according to one embodiment of the present invention.

Referring to FIG. 5 illustrates the reference die and locator die for partial wafer processing. Locator die is the last die in the same row of reference die or auxiliary reference die of the partial wafer. No locator die for the last partial wafer P5.

Figure 6:
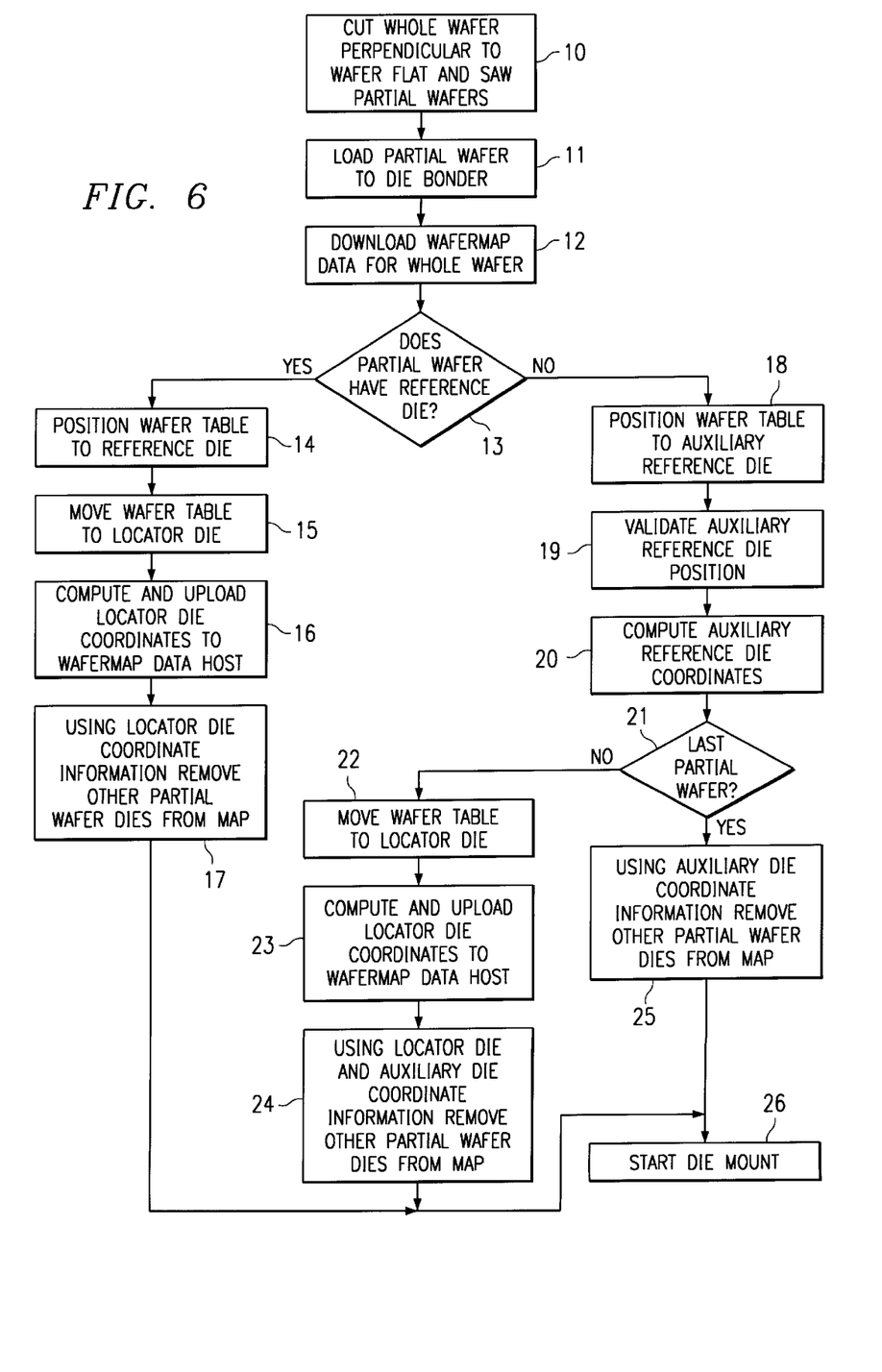
FIG. 6 is a flow chart for partial wafer processing.
Figure 7:
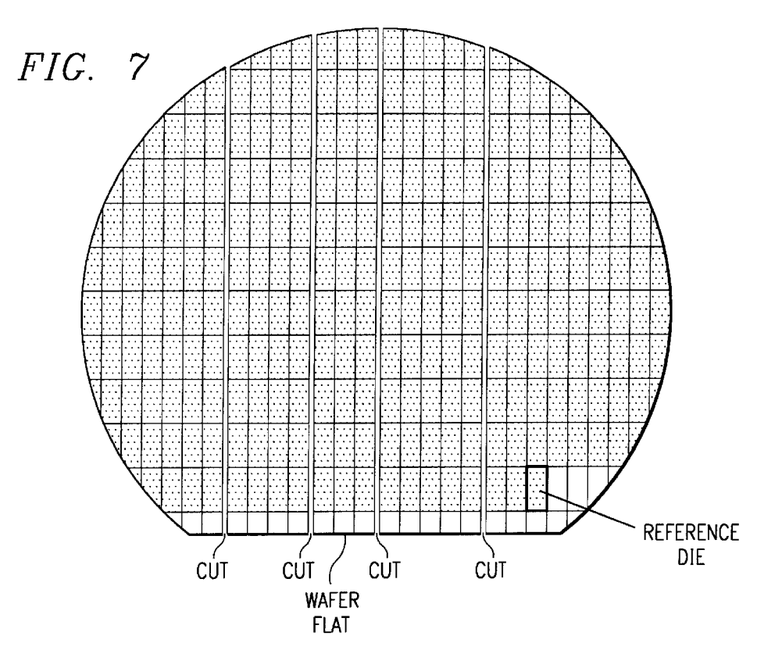
FIG. 7 illustrates wafer cut perpendicular to wafer flat.
Figure 8:
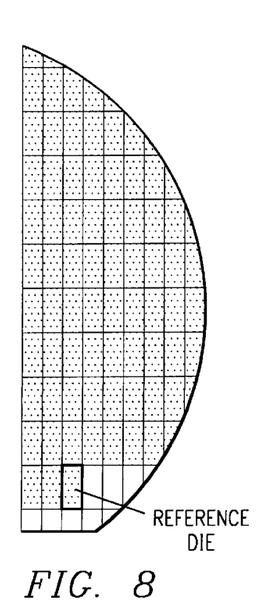
FIG. 8 illustrates a partial wafer with reference die.
Figure 9:
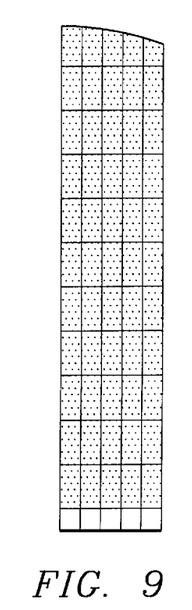
FIG. 9 illustrates a partial wafer without a reference die.
Figure 10:
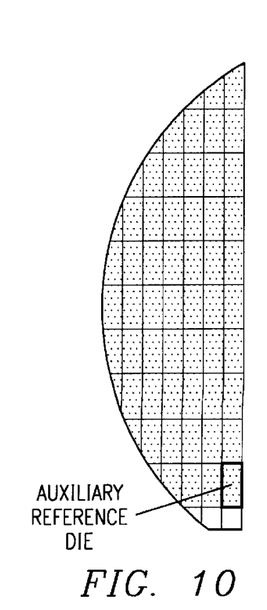
FIG. 10 illustrates last partial wafer with auxiliary reference die.

Referring the FIG. 6, there is illustrated a flow chart for the processor in FIG. 1 for partial wafer processing. FIG. 7 illustrates the wafer cut perpendicular to wafer flat. FIG. 8 illustrates partial wafer with reference die and FIG. 9 illustrates partial wafer without reference die. FIG. 10 illustrates the last partial wafer of a wafer and its auxiliary reference die.

The following assumption are made for the partial wafer processing.

Figure 11:
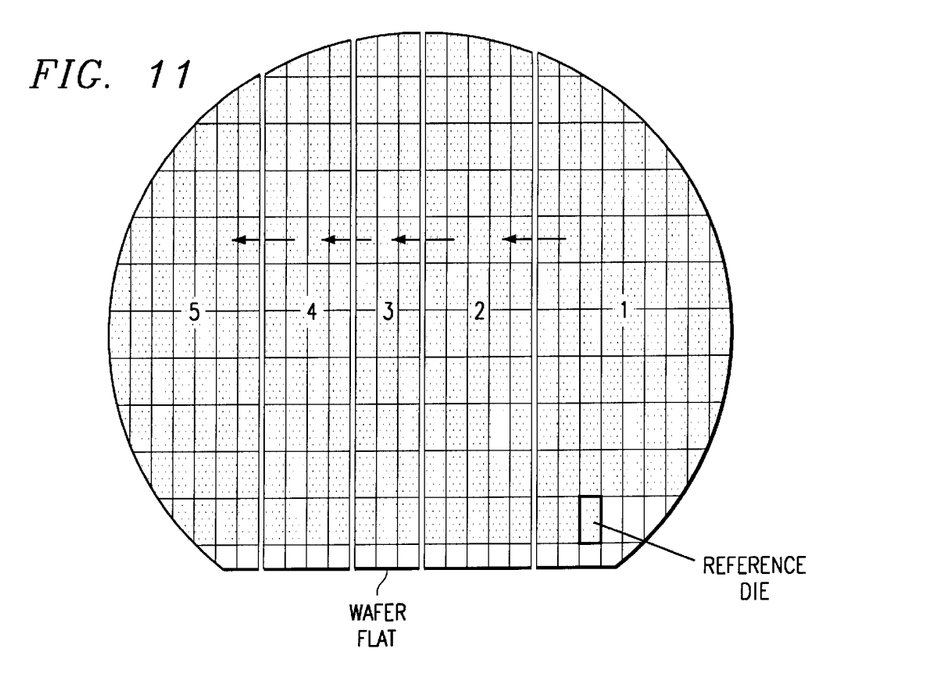
FIG. 11 illustrates typical wafer cuts and process sequence.

See FIG. 11:
1. All wafer cuts to form partial wafer are to be done perpendicular to the wafer flat.
2. The first partial wafer must contain a reference die
3. The last partial wafer must contains at least one full die in the reference die row.
4. Process one partial wafer at a time and process next partial wafer from right to left after the previous partial wafer has completed processing.

The following steps are based on the zero degree of wafer rotation angle. The same steps are also used for different rotation angles.

Step 10: Cut a whole wafer perpendicular to wafer flat to form partial wafers and saw partial wafers along thoroughfare into die pieces on a tape backing;

Step 11: Load partial wafer into Die Bonder (after Saw).

Step 12: Download wafermap data for the whole wafer from wafermap data host.

Step 13: If the partial wafer loaded does not have reference die then go to step 18.

Step 14: Position wafer table to reference die located at lower right of partial wafer in the die row closest to the wafer flat.

Figure 12:
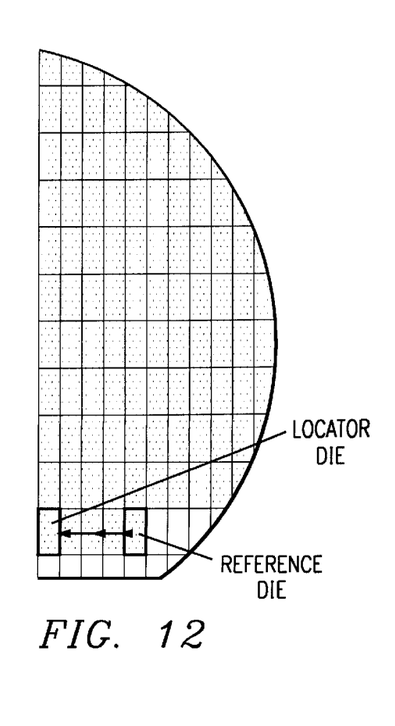
FIG. 12 illustrates moving wafer table to locator die from reference die.
Figure 13:
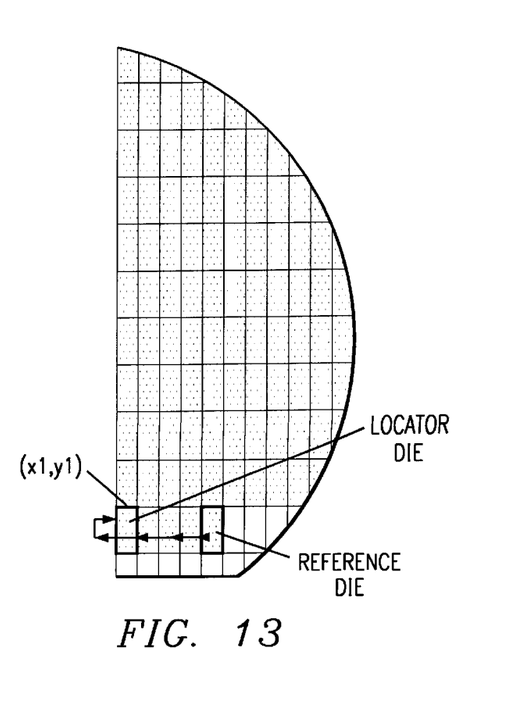
FIG. 13 illustrates moving wafer table to locator die from reference die in automatic mode.

Step 15: Move the wafer table parallel to the wafer flat to the locator die by automatic or manual means. See FIGS. 12 and 13. Move wafer table from reference die parallel to the wafer flat and along the same row as the reference die to the left to locator die. This is the last die in the row of the partial wafer. For the automatic mode move the table from the reference die along the same row as the reference die to the left noting coordinates one die at a time to the end of the partial wafer and the locator die is (x1, y1).

Step 16: Compute and upload the locator die coordinates to wafermap data host.

Step 17: Using locator die coordinates information remove other partial wafer dies from the map.

Figure 19:
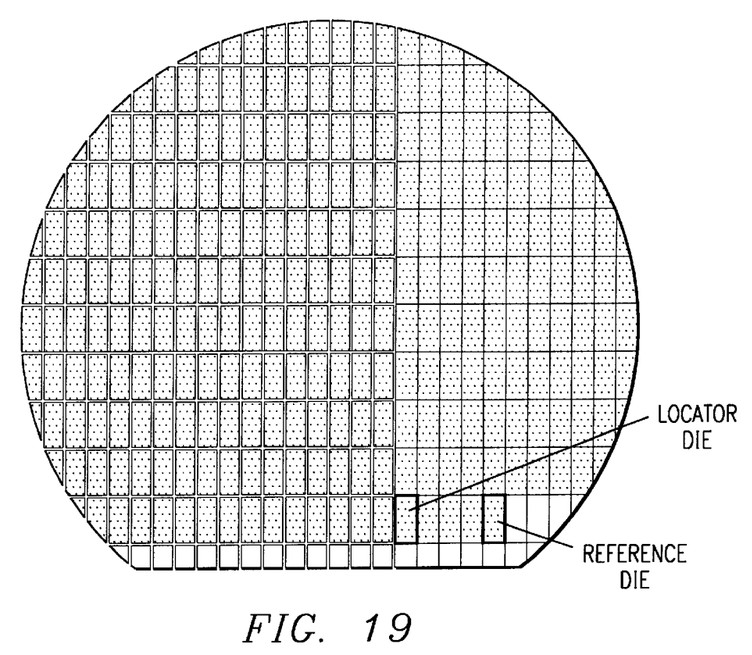
FIG. 19 illustrates removal of other partial wafers die coordinates from map.

Avoid all moves to dies in other partial wafers as follows:

a. Locator die coordinate (x1, y1) is known.

b. Remove all dies in the map which has the x coordinate greater than x1. See FIG. 19.

Go to step 26.

Step 18: Position the wafer table to auxiliary reference die.

Step 19: Validate auxiliary reference die position.

The following method is used to validate the auxiliary reference die position of the partial wafer.

Figure 16:
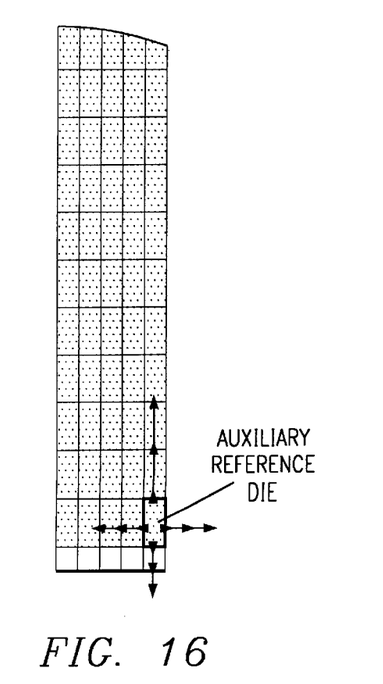
FIG. 16 illustrates validating auxiliary reference die position in a partial wafer.

For the partial wafer the following steps are true:

a. Auxiliary reference die row is same as reference die row.

b. From auxiliary reference die position, if wafer table is moved in four directions (left, right, up, down) for a certain minimum number of times, all moves in the right direction of auxiliary reference die should not see any die. See FIG. 16.

Step 20: It computes auxiliary reference die coordinates for the particular partial wafer as follows: Locator die coordinate is (x1, y1) known from step 15.

Auxiliary reference die coordinate (x2, y2) is $$x2=x1+1$$
$$y2=y1$$

Figure 17:
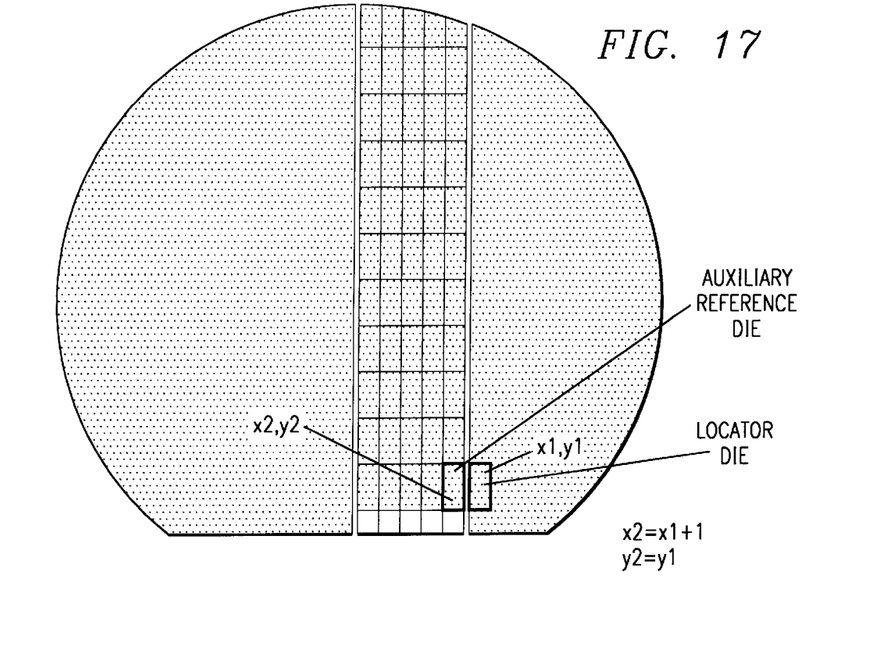
FIG. 17 illustrates computation of auxiliary reference die coordinates in a partial wafer.
Figure 18:
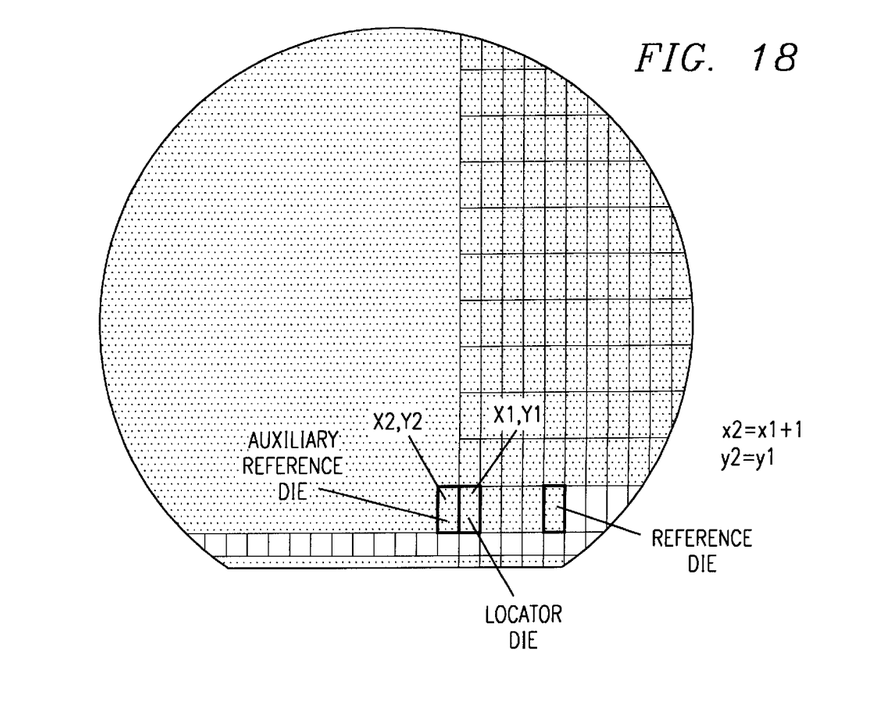
FIG. 18 illustrates computation of auxiliary reference die coordinates in a partial wafer.

See FIGS. 17 and 18.

Step 21: If this partial wafer is the last partial wafer for this wafer then go to step 25.

Figure 14:
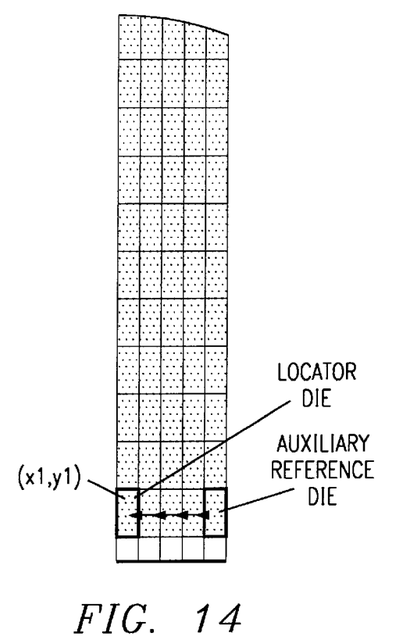
FIG. 14 illustrates moving wafer table to locator die from auxiliary reference die.
Figure 15:
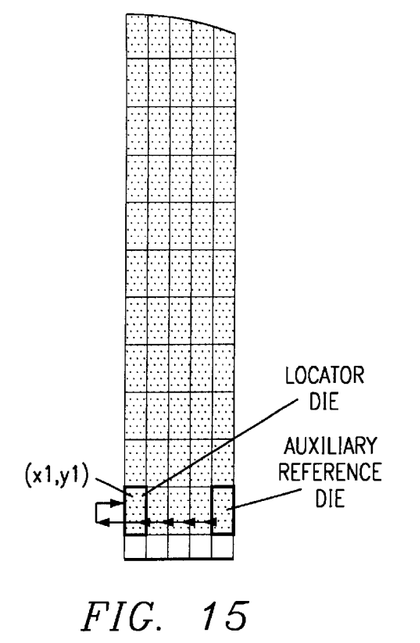
FIG. 15 illustrates moving wafer table to locator die from auxiliary reference die in automatic mode.

Step 22: Move the table to the locator die by automatic or manual means. See FIGS. 14 and 15. Move wafer table from auxiliary reference die parallel to said wafer flat along the same row as auxiliary reference die to the left to locator die. This is the last die in the row of the partial wafer. For the automatic mode move the table from the auxiliary reference die along the same row as the reference die to the left noting coordinates one die at a time to the end of the partial wafer and the locator die is (x1, y1).

Step 23: Compute and upload the locator die coordinates to wafermap data host.

Step 24: Using locator die and auxiliary reference die coordinate information remove other partial wafer dies from the map.

Avoid all moves to dies in other partial wafers as follows:

a. Locator die coordinate (x1, y1) is known.

b. Remove all dies in the map which has the x coordinate greater than x1.

c. Auxiliary reference die coordinate (x2,y2) is known.

d. Remove all dies in the map which has the x coordinate less than x2.

Figure 20:
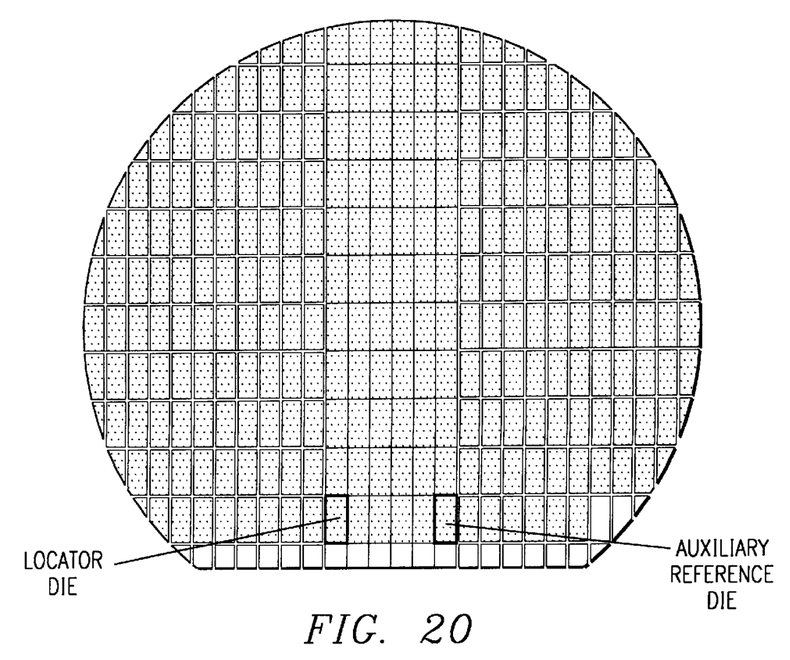
FIG. 20 illustrates removal of other partial wafers die coordinates from map.

See FIG. 20. Go to step 26.

Step 25: Using auxiliary reference die coordinate information remove other partial wafer dies from the map.

Avoid all moves to dies in other partial wafers as follows:

a. Auxiliary reference die coordinate (x2,y2) is known.

b. Remove all dies in the map which has the x coordinate less than x2.

Figure 21:
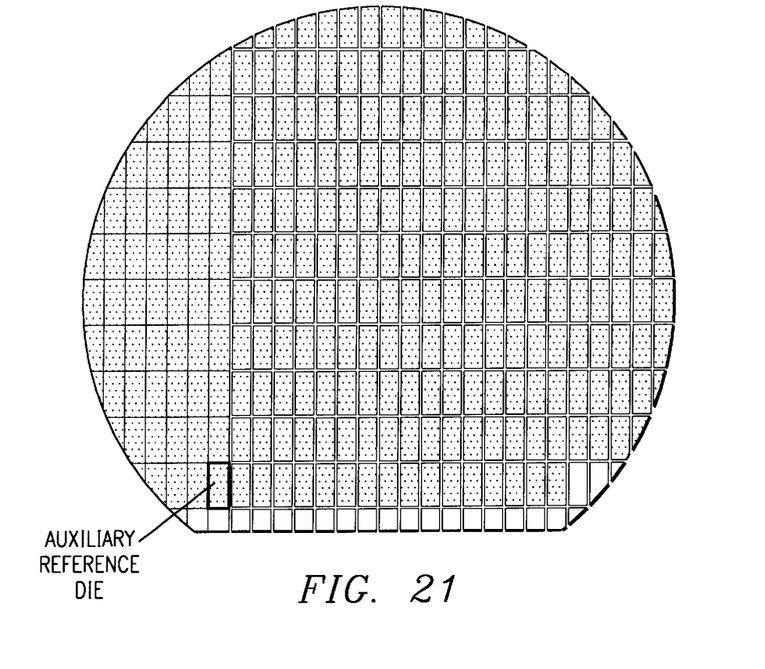
FIG. 21 illustrates removal of other partial wafers die coordinates from map.

See FIG. 21.

Step 26: Start die mount using map.

Figure 22:
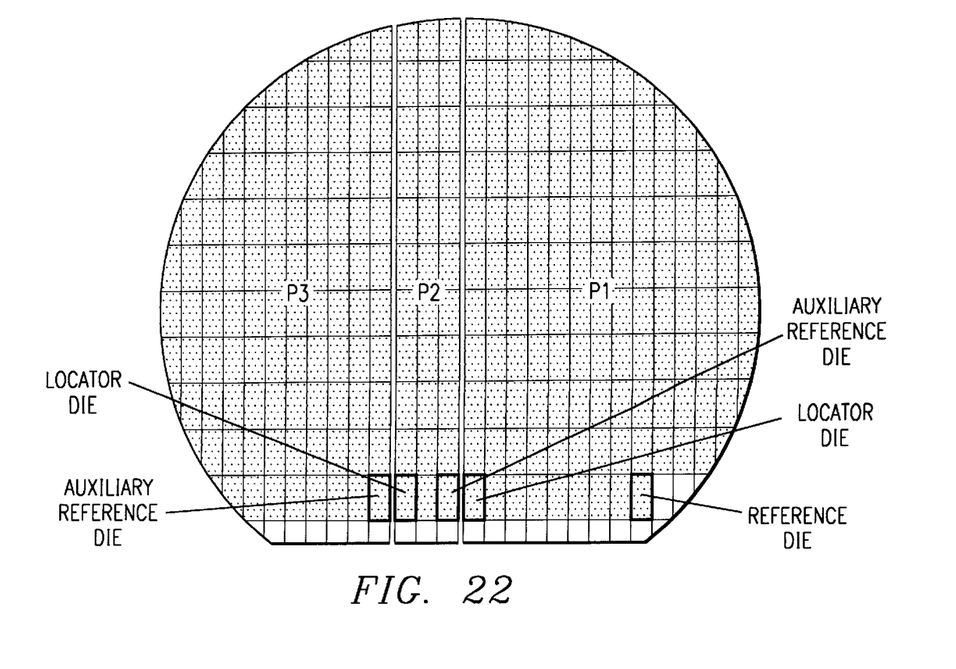
FIG. 22 illustrates reference die, auxiliary reference die and locator die.

The locator die can be any die in the wafer, even the reference die and depends on the cut of the wafer. Any die in the wafer can be the auxiliary reference die except the reference die and it may change to different positions depending on the cut of the wafer. The process creates an auxiliary reference die in case the partial wafer dies not have a reference die and the auxiliary reference die acts as the reference die for the partial wafer map operation. FIG. 22 shows the locator die and auxiliary reference die positions for different wafer cuts.

Although the present invention and its advantages have been described in detail, it should be understood that various changes, substitutions and alterations can be made herein without departing from the spirit and scope of the invention as defined by the appended claims.

What is claimed is:

1. A method of processing a wafer in die bonders containing dies and having a wafer flat comprising the steps of:

cutting a whole wafer with cuts perpendicular to the wafer flat to produce partial wafers;

sawing said partial wafers along thoroughfares to form dies on a backing;

downloading a wafer map of said whole wafer into a processor;

loading one of said partial wafers onto a processing table;

searching for a reference die and an auxiliary reference die;

if said reference die is found moving said table and said partial wafer to the left along a reference die row parallel to said wafer flat until end of dies in the reference die row to find a locator die, determining locator die coordinates and removing other partial wafer dies from said map using said. locator die coordinates; and mounting said partial wafer dies using said map.

2. The method of claim 1 including the further step before mounting of said partial wafer dies of moving the table positioning said wafer table to said auxiliary reference die on the same row as said reference die and running parallel to said wafer flat as the reference die, moving the table to the left along the reference die row to the last die in the partial wafer to find a locator die and locator die coordinates and removing other partial wafer dies from said map using said auxiliary reference die coordinates and said locator die coordinates if said reference die is not found in said partial wafer and not the last partial wafer.

3. The method of claim 2 including before mounting of said partial wafer dies the further step of determining auxiliary reference die coordinates and removing other wafer dies from the map using said auxiliary reference die coordinates if said reference die is not found and said partial wafer is a last partial wafer.

4. The method of claim 1 including the step before mounting of said partial wafer dies the step of determining auxiliary reference die coordinates and removing other wafer dies from the map using said auxiliary reference die coordinates if said reference die is not found and said partial wafer is a last partial wafer.

5. The method of claim 3 wherein said auxiliary reference die is validated by all moves to the right not seeing any die.

6. The method of claim 3 wherein said partial wafers are taken in order from right to left from that containing the reference die.

7. The method of claim 6 wherein said auxiliary reference die coordinates is located by adding one die step on the reference die row from the locator die of the previous partial wafer.

* * * * *